United States Patent
Seipel

(10) Patent No.: US 9,508,878 B2
(45) Date of Patent: Nov. 29, 2016

(54) SOLAR CELL HAVING A REAR SIDE METALLIZATION

(71) Applicant: SOLARWORLD AMERICAS INC., Hillsboro, OR (US)

(72) Inventor: Bjoern Seipel, Beaverton, OR (US)

(73) Assignee: SolarWorld Americas Inc., Hillsboro, OR (US)

( * ) Notice: Subject to any disclaimer, the term of this patent is extended or adjusted under 35 U.S.C. 154(b) by 0 days.

(21) Appl. No.: 14/493,473

(22) Filed: Sep. 23, 2014

(65) Prior Publication Data
US 2016/0087121 A1 Mar. 24, 2016

(51) Int. Cl.
*H01L 31/0224* (2006.01)
*H01L 31/068* (2012.01)
*H01L 31/18* (2006.01)

(52) U.S. Cl.
CPC ........ *H01L 31/022441* (2013.01); *H01L 31/022425* (2013.01); *H01L 31/068* (2013.01)

(58) Field of Classification Search
CPC ............ H01L 31/0516; H01L 31/22441
See application file for complete search history.

(56) References Cited

U.S. PATENT DOCUMENTS

2006/0130891 A1* 6/2006 Carlson ............. H01L 31/02168
136/256
2010/0275965 A1 11/2010 Lee et al.
2010/0294358 A1* 11/2010 Nakanishi ............... H01L 24/29
136/256
2011/0056554 A1* 3/2011 Yamamoto ...... H01L 31/022425
136/256
2012/0060911 A1* 3/2012 Fu ................... H01L 31/022425
136/256
2013/0118572 A1* 5/2013 Kim ..................... H01L 31/0224
136/256
2013/0273687 A1* 10/2013 Akimoto ......... H01L 31/022441
438/98
2015/0280027 A1* 10/2015 Moors ............. H01L 31/022441
136/256

FOREIGN PATENT DOCUMENTS

EP           2511957 A2    10/2012

OTHER PUBLICATIONS

European Search Report based on Application No. 15167841.4 (10 Pages) dated Mar. 10, 2016 (Reference Purpose Only).

* cited by examiner

*Primary Examiner* — Jennifer Michener
*Assistant Examiner* — Bethany L Martin
(74) *Attorney, Agent, or Firm* — Viering, Jentschura & Partner mbB

(57) ABSTRACT

Various embodiments provide a solar cell. The solar cell includes a substrate having a front side and a rear side. At least the front side receives light. The solar cell further includes a multiplicity of rear side solder pad regions at least partially arranged over the rear side, and a plurality of partial solder pads formed in each rear side solder pad region of the multiplicity of rear side solder pad regions. Each partial solder pad includes a first metal. The partial solder pads in a respective rear side solder pad region are separated from each other. The solar cell further includes a rear side metallization formed at the rear side of the substrate partly overlapping the partial solder pads, the rear side metallization including a second metal different from the first metal.

16 Claims, 4 Drawing Sheets

FIG 3C

SOLAR CELL HAVING A REAR SIDE METALLIZATION

TECHNICAL FIELD

Various embodiments relate generally to a solar cell having rear side metallization.

BACKGROUND

Conventional solar cells have a rear side metallization provided over a plurality of rear side solder pads, wherein the rear side solder pads usually have a rectangular or oval shape. Usually, the rear side solder pads are made of silver. This may result in a significant silver consumption and in a damage of a backside passivation provided over the rear side metallization. Thus, a high number of rear side solder pads or full busbars may be needed to ensure module reliability.

SUMMARY

Various embodiments provide a solar cell. The solar cell includes a substrate having a front side and a rear side. At least the front side receives light. The solar cell further includes a multiplicity of rear side solder pad regions at least partially arranged over the rear side, and a plurality of partial solder pads formed in each rear side solder pad region of the multiplicity of rear side solder pad regions. Each partial solder pad includes a first metal. The partial solder pads in a respective rear side solder pad region are separated from each other. The solar cell further includes a rear side metallization formed at the rear side of the substrate partly overlapping the partial solder pads, the rear side metallization including a second metal different from the first metal.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 3A to 3H show top views of a conventional partial solder pad (FIG. 3A) and various partial solder pads in accordance with various embodiments (FIG. 3B to FIG. 3H).

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments provide a solar cell, wherein a reduction of silver consumption used for solder back pads, in other words for rear side solder pads, which will also be referred to as partial solder pads. Furthermore, various embodiments provide for a reduction of surface recombination area due to the solder back pads. Moreover, in various embodiments, an increase in effective aluminium-silver (Al—Ag) overlap may be achieved. Further, an improved stress distribution during soldering may be provided in various embodiments. In various embodiments, no area back (rear) solder pad completely filled with metal is provided. This may result in an improved stress distribution (which may be understood as the so-called nail bed approach).

In various embodiments, a solar cell is provided, the rear side solder pads of which provide a plurality of sub pads, which are isolated and separated from each other, in each rear side solder pad region instead of the conventional design, in which the entire rear side solder pad region is filled with metal forming exactly one rear side solder pad in each rear side solder pad region. In other words, illustratively, Using a plurality of miniature (sub) rear side solder pads are used instead of a full area rear side solder pad, respectively. This disclosure provides e.g. dots, in other words dot-like shape partial solder pads, however, without limitation with respect to the shape of the provided partial solder pads. The partial solder pads may e.g. have a polygonal shape (e.g. triangular or rectangular or pentagonal or hexagonal or octagonal and the like) and/or a round shape (e.g. elliptical or circular and the like).

Figure 1:
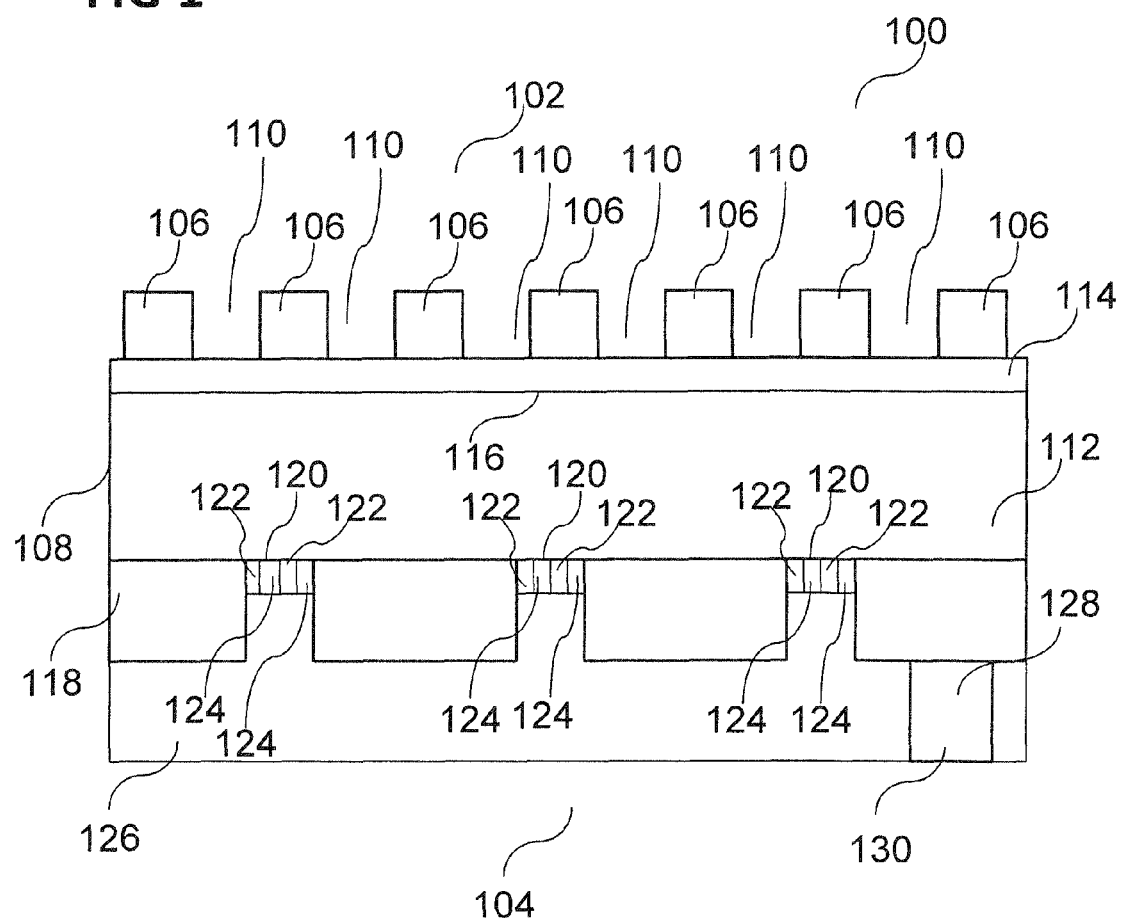
FIG. 1 shows a cross sectional view of a solar cell in accordance with various embodiments.

FIG. 1 shows a cross sectional view of a solar cell 100 in accordance with various embodiments.

The solar cell 100 may be a silicon solar cell 100, e.g. a crystalline silicon solar cell 100, e.g.

a single-crystalline silicon solar cell 100; or
a poly-crystalline silicon solar cell 100; or
a nano-crystalline silicon solar cell 100; or
an amorphous silicon solar cell 100; or
a quasi-mono-crystalline silicon solar cell 100.

The solar cell 100 may be configured as one of the following types of solar cells, for example:

a passivated emitter and rear cell—PERC; or
a passivated rear locally diffused cell—PERL; or
any other type of solar cell, as desired.

In various embodiments, the solar cell 100 may have a front side 102 and a rear side 104. At least the front side 102 is configured to receive light. Therefore, the front side 102 may also be referred to as the light impinging side 102 of the solar cell 100. However, it is to be noted that in various embodiments, the solar cell 100 may be configured as a so-called bifacial solar cell, e.g. as a so-called bifacial PERC solar cell. A bifacial solar cell 100 is to be understood as a solar cell 100, which also has a grid of contact fingers (e.g. made of aluminum) on the rear side 104 of the solar cell 100 (not shown in the figures).

Optionally, the solar cell 100 includes a plurality of front side contacts 106 on the front side 102 of the solar cell 100. The optional front side contacts 106 may be formed on a solar cell substrate 108 and illustratively serve to collect electrical charge carriers generated within the solar cell substrate 108. The solar cell substrate 108 includes an optically active region 110.

The front side contacts 106 may be formed directly on the front side surface of the solar cell substrate 108, i.e. on the front side 102 of the solar cell 100. By way of example, the front side contacts 106 may be configured as a front side metallization. The front side contacts 106 may be patterned over the optically active region 110, e.g. as so-called contact fingers as a metallization or e.g. as a selective emitter or as a combination thereof. A patterned front side metallization may e.g. be formed substantially only over or on the optically active region 110 (except for electric cross lines).

The optically active region 110 of the solar cell 100 may include an electrically conductive and/or semiconductive material, e.g. a doped silicon, e.g. p doped (p type), e.g. doped with dopants of boron, gallium and/or indium, or n doped (n type), e.g. doped with dopants of phosphorous, arsenic and/or antimon.

The optically active region 110 may absorb electromagnetic radiation and may generate photo current out of this. The electromagnetic radiation may have a wavelength range which include UV radiation (A to C), visible light and/or infrared radiation (A to C).

The optically active region 110 includes a first region 112, which is doped with a dopant of a different doping type as a second region 114. The first region 112 is in physical contact with the second region 114 and share a common interface. By way of example, the first region 112 may be a p type (doped with p dopant(s)) and the second region may be an n type (toped with n dopant(s)), and vice vera. A pn junction is formed at the interface between the first region 112 and the second region 114. Positive charge carriers (e.g. holes) and negative charge carriers (e.g. electrons) may be separated in the pn junction. The optically active region 110 may include a plurality of pn junctions, which may be arranged next to each other or one above the other.

A rear side contact structure is formed at the rear side 104 of the solar cell 100. The rear side contact structure optionally may include a dielectric layer structure 118 and a multiplicity of (i.e. at least three) solder pad regions 120. The dielectric layer structure 118 may include one or a plurality of (i.e. at least two) dielectric layers. A plurality of so-called local contact openings partially exposing a rear side of the solar cell substrate 108 may be formed through the dielectric layer structure 118.

Dielectric material, e.g. dielectric material of the dielectric layer structure 118 may be laterally disposed between the solder pad regions 120. In various embodiments, each rear side solder pad region 120 of the multiplicity of rear side solder pad regions 120 may have a covered surface area greater than 10 mm². The distance between respective two rear side solder pad regions 120 may be in the range from about 2 mm to about 20 mm, e.g. in the range from about 5 mm to about 15 mm, e.g. in the range from about 7 mm to about 12 mm. As shown in FIG. 1, a plurality of (i.e. at least two) partial solder pads 122 may be arranged in each solder pad region 120. As will be described in more detail below, the partial solder pads 122 may in general have any desired shape. Furthermore, the partial solder pads 122 are separated, e.g. laterally electrically insulated from each other within each of the solder pad regions 120. Dielectric material 124 may be arranged laterally between the partial solder pads 122 within each of the solder pad regions 120. As an alternative, semiconducting material 124 such as e.g. silicon may be arranged laterally between the partial solder pads 122 within each of the solder pad regions 120. The partial solder pads 122 may include or essentially consist of a metal (in the following also referred to as a first metal), e.g. silver and/or nickel. In various embodiments, the smallest distance between respective two partial solder pads 122 in a respective rear side solder pad region 120 may be in the range from about 0.1 mm to about 1.0 mm, e.g. in the range from about 0.3 mm to about 0.8 mm, e.g. in the range from about 0.5 mm to about 0.6 mm. As will be described in more detail below, at least two rows of partial solder pads 122 may be formed in each rear side solder pad region 120 of the multiplicity of rear side solder pad regions 120. Furthermore, at least four partial solder pads 122 may be formed in each rear side solder pad region 120 of the multiplicity of rear side solder pad regions 120.

The local contact openings may be formed as trenches (having any desired cross section and having any desired shape), e.g. by means of one or more laser beams, which e.g. may be generated by means of one or more lasers. The extension of the local contact openings may be limited by corresponding controlling of the laser beam(s). As an alternative, the extension of the local contact openings may be limited by means of a shadow mask. As an alternative, the local contact openings may be etched. It is to be noted that the local contact openings may be formed in any desired form, e.g. as trenches.

In various embodiments, the dielectric layer structure 118 (which may also be referred to as passivation layer 118) may include a first dielectric layer, wherein the first dielectric layer may be formed, e.g. deposited, on or over the optically active region 110 at the rear side 104 of the solar cell substrate 108. Furthermore, the dielectric layer structure 118 may include a second dielectric layer. The second dielectric layer may be formed, e.g. deposited, on or over the first dielectric layer.

The first dielectric layer may include or essentially consist of the same material as the second dielectric layer. The first dielectric layer may include silicon nitride (e.g. $Si_3N_4$), silicon oxide (e.g. $SiO_2$) and/or silicon oxynitride (SiON), alternatively e.g. aluminum oxide (e.g. $Al_2O_3$). The first dielectric layer may have a lower refractive index than the second dielectric layer (at the same wavelength). In general, the dielectric layer structure 118 may include or essentially consist of any material which is suitable for a passivation of the rear side of the solar cell substrate 108, with which the material of the rear side metallization (e.g. aluminum) cannot form an alloy, as will be described in more detail below.

In various embodiments, the dielectric layer structure 118 may have a layer thickness in the range from about 10 nm to about 500 nm, e.g. in the range from about 20 nm to about 250 nm.

Furthermore, a rear side metallization 126 may be formed at the rear side 104 of the substrate 100, which may partly overlap the partial solder pads 124. The rear side metallization 126 may include a second metal different from the first metal. The rear side metallization 126 may include or essentially consist of e.g. aluminum. The rear side metallization 126 may also be partially formed in the local contact openings and may form a physical contact and thus a common interface with the first metal (e.g. silver or nickel) of the partial solder pads 122. Thus, a plurality of local contacts may be formed in each of the solder pad regions 120. In other words, a plurality of vertical current paths (each formed by a respective partial solder pad 122) may be provided in each of the solder pad regions 120 (from the rear side of the solar cell substrate 108 to the rear side metallization 126), which are laterally separated from each other.

The second metal may be formed on or over the first metal in the local contact openings.

Furthermore, in various embodiments, plane openings 128 may be provided in the rear side metallization 126, which may include or essentially consist of a further, e.g. well solderable, metallization (also referred to as further rear side metallization 130), such as e.g. silver, nickel, and/or tin. The further rear side metallization 130 may be arranged over non-opened portions of the dielectric layer structure 118, as exemplarily shown by means of the plane opening 128 in FIG. 1.

The rear side contact structure may be configured to collect the light induced charge carriers, which are discharged from the local contact openings from the optically active region 110 of the solar cell substrate 108. In other words, the dielectric layer structure 118 may include one or more electrically conductive regions, which are configured to electrically connect the optically active region 110, e.g. as through contacts or intermediate connections. The through contacts 122, 126 may be formed as electrically conductive regions in the dielectric layer structure (in other words in the passivation layer) 118 such that a continuous electrically conducting connection is formed through the entire dielectric layer structure 118.

In various embodiments, a solar cell module including a plurality of such solar cells 100 may be provided. The plurality of solar cells 100 may be electrically connected with each other in series and/or in parallel.

Figure 2:
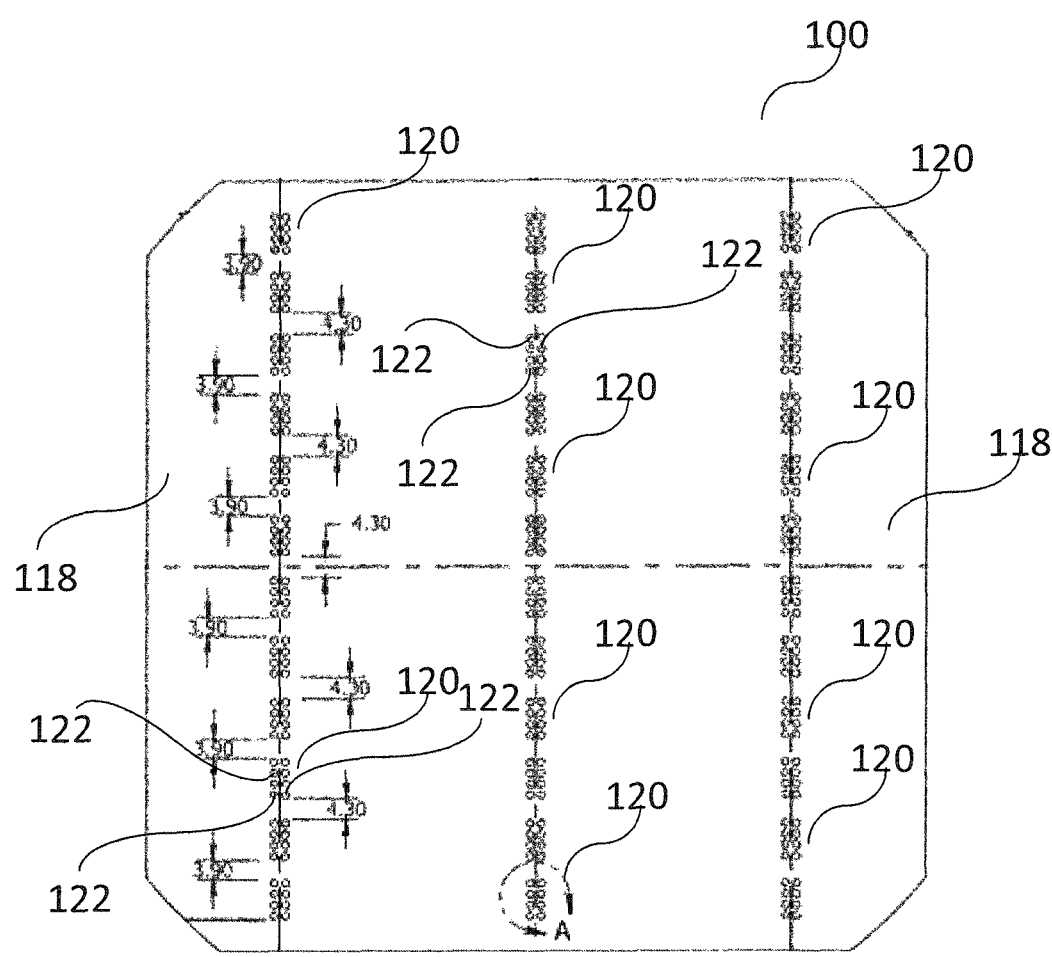
FIG. 2 shows a bottom view of a solar cell in accordance with various embodiments.

FIG. 2 shows a bottom view of the solar cell 100 of FIG. 1 in accordance with various embodiments. It is to be noted that FIG. 2 shows the bottom view of the solar cell 100, wherein the reas side metallization is not shown and this, in this view, the dielectric layer structure 118 and the partial solder pads 122 are shown.

As shown in FIG. 2, the solar cell includes on its rear side a multiplicity of solder pad regions 120. The solder pad regions 120 may be arranged in a matrix-like arrangement in rows and columns. However, in general, the solder pad regions 120 may be arranged in any other desired regular or irregular pattern along the rear side of the solar cell 100. In various embodiments, the solder pad regions 120 may be provided in three columns and twelve rows, so that 36 solder pad regions 120 may be provided, however, any other number of solder pad regions 120 as well as any other arrangement may be provided in alternative embodiments. As will be described in more detail below, each solder pad region 120 may include a plurality of partial solder pads 122, which may be separated from each other. The solder pad regions 120 may be separated from each other, e.g. laterally electrically isolated from each other, e.g. by means of dielectric material of the dielectric layer structure 118. In other words, the solder pad regions 120 may be arranged with a distance from each other. The distance (from edge to edge, e.g. along one column) of adjacent solder pad regions 120 may e.g. be in the range from about 3 mm to about 6 mm, e.g. in the range from about 3.5 mm to about 5 mm, e.g. in the range from about 4 mm to about 4.5 mm, e.g. about 4.3 mm or about 3.9 mm. The solder pad regions 120 may be arranged at different differences from each other, for example with two different distances in alternating manner, e.g. along a column at a first distance (e.g. about 3.9 mm), a second distance (e.g. about 4.3 mm), the first distance (e.g. about 3.9 mm), the second distance (e.g. about 4.3 mm), the first distance (e.g. about 3.9 mm), the second distance (e.g. about 4.3 mm), and so on. Any other arrangement may be provided, if desired.

As previously mentioned, in the conventional solar cells, each solder pad region was completely covered with a metal such as e.g. silver or nickel, whereas in accordance with various embodiments, the solder pad regions 120 include a plurality of partial solder pads 122 being separate from each other, so that only a portion of each solder pad regions 120 is covered by a metal, e.g. the first metal, e.g. with silver or nickel. In general, in various embodiments, the surface e.g. of the rear side of the solar cell substrate 108, is only partially covered by a metal in each of the rear side solder pad regions. The remaining portions of the solder pad regions 120 may include a dielectric or semiconducting material, e.g. dielectric material of the dielectric layer structure 118 (as an example of a dielectric material) or e.g. the material of the solar cell substrate 108, e.g. silicon.

The number and the shape of the plurality of partial solder pads 122 within a respective one of the multiplicity of solder pad regions 120 is in general arbitrary. In the following, some examples for partial solder pads 122 will be described in more detail. Illustratively, FIG. 3A to FIG. 3H show top views of a conventional partial solder pad (FIG. 3A) and various partial solder pads in accordance with various embodiments (FIG. 3B to FIG. 3H).

Figure 3A:
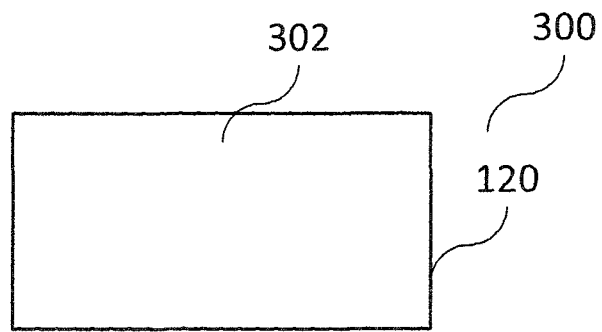

FIG. 3A shows an enhanced view of a conventional partial solder pad 300 (e.g. an enhanced view of region A in FIG. 2) as would be conventionally provided in each of the solder pad regions 120. As shown in FIG. 3A, the entire area (100%) of the solder pad regions 120 (and thus the entire rear side surface of the solar cell substrate 108 of the solder pad regions 120) would be covered (in other words filled) with a metal 302, e.g. with the first metal (e.g. silver or nickel).

Figure 3B:
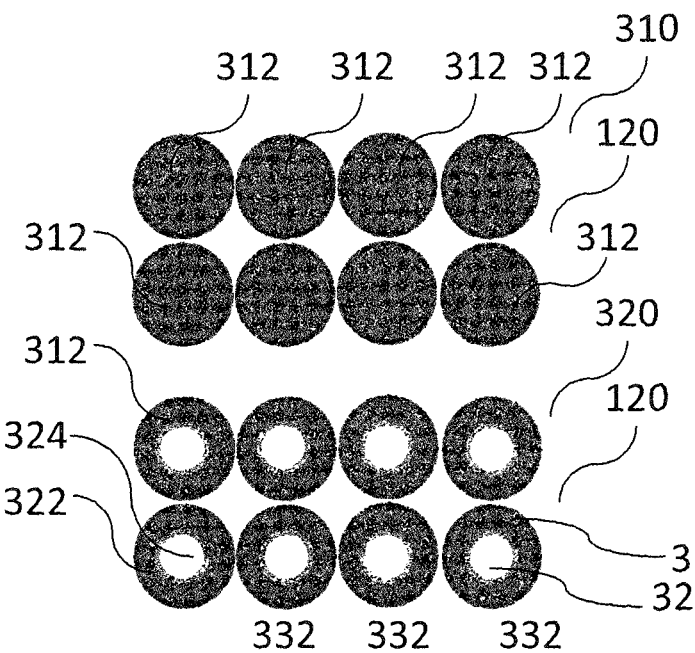

FIG. 3B shows an enhanced view of a partial solder pad 310 (e.g. an enhanced view of region A in FIG. 2) as would be provided in each of the solder pad regions 120 in accordance with various embodiments. As shown, only a portion, i.e. less than 100% of the area of the solder pad regions 120 (and thus only a portion of the rear side surface of the solar cell substrate 108 of the solder pad regions 120) is covered (in other words filled) with a metal 312, e.g. with the first metal (e.g. silver or nickel). In this example, about 64% of the area of the solder pad regions 120 is covered (in other words filled) with the metal 312. In this example, the partial areas covered (in other words filled) with metal (and thus the partial solder pads 122, 312) have a round, e.g. circular, cross section, however, in general, the partial areas (and thus the partial solder pads 122, 312) may have any shape in cross section as desired. In this example, the partial solder pads 122, 312 may have a round shape with a diameter in the range from about 1.5 mm to about 4 mm, e.g. about 1.8 mm. In this example, the solder pad region 120 includes two rows and four columns of partial solder pads 122, 312, resulting in eight partial solder pads 122, 312 altogether. The lateral minimum distance between respective two partial solder pads 122, 312 may be e.g. 0.4 mm.

FIG. 3C shows an enhanced view of a partial solder pad 320 (e.g. an enhanced view of region A in FIG. 2) as would be provided in each of the solder pad regions 120 in accordance with various embodiments. In this example, even substantially less than about 64% of the area of the solder pad regions 120 is covered (in other words filled) with the metal 312. In this example, the partial areas covered (in other words filled) with metal (and thus the partial solder pads 122, 322) have a round, e.g. circular, O-ring cross section. In this example, the partial solder pads 122, 322 may have a round shape with an outer diameter in the range from about 1.5 mm to about 4 mm, e.g. about 1.8 mm, and with an inner diameter of at least 0.5 mm, e.g. an inner diameter in the range from about 0.5 mm to about 1 mm. An inner (in other words central) region 324 of each O-ring like partial solder pad 122, 322 may be free from the metal. In this example, the solder pad region 120 includes two rows and four columns of partial solder pads 122, 322, resulting in eight partial solder pads 122, 312 altogether. The lateral minimum distance between respective two partial solder pads 122, 312 may be e.g. 0.4 mm.

Figure 3D:
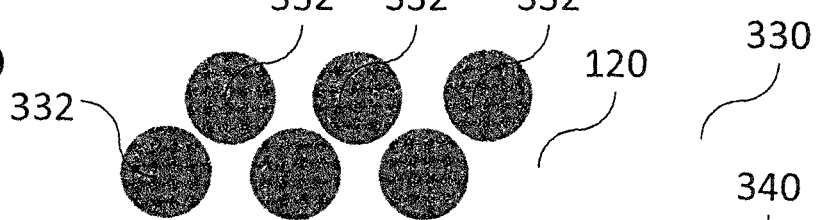

FIG. 3D shows an enhanced view of a partial solder pad 330 (e.g. an enhanced view of region A in FIG. 2) as would be provided in each of the solder pad regions 120 in accordance with various embodiments. In this example, the partial areas covered (in other words filled) with metal (and thus the partial solder pads 122, 332) have a round, e.g. circular, cross section, however, in general, the partial areas (and thus the partial solder pads 122, 332) may have any shape in cross section as desired. In this example, the partial solder pads 122, 332 may have a round shape with a diameter in the range from about 1.5 mm to about 4 mm, e.g. about 1.8 mm. In this example, the solder pad region 120 includes two rows of partial solder pads 122, 332, wherein the centers of the partial solder pads 122, 332 of different rows are laterally offset to one another. In this example, six partial solder pads 122, 332 are provided altogether. The minimum distance between respective two partial solder pads 122, 312 of two different rows may be e.g. 0.4 mm. This arrangement achieves a further reduction of the used metal for the partial solder pads 332 be 25% as compared to the arrangement of FIG. 3B.

Figure 3E:
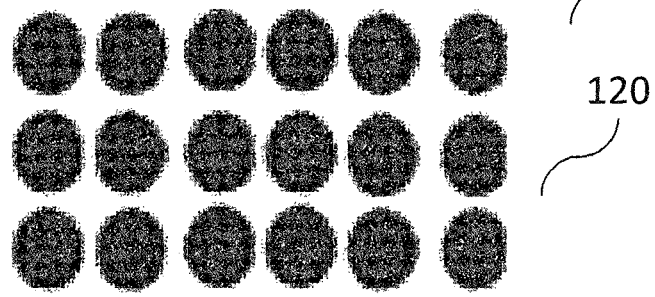
Figure 3F:
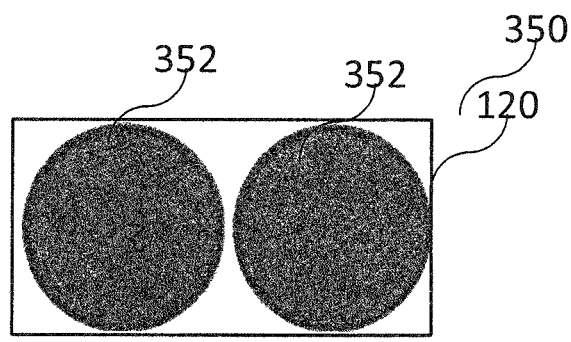

FIG. 3E shows an enhanced view of a partial solder pad 340 (e.g. an enhanced view of region A in FIG. 2) as would be provided in each of the solder pad regions 120 in accordance with various embodiments. As shown, only a portion, i.e. less than 100% of the area of the solder pad regions 120 is covered (in other words filled) with a metal 342, e.g. with the first metal (e.g. silver or nickel). In this example, about 50% of the area of the solder pad regions 120 is covered (in other words filled) with the metal 342. In this example, the partial areas covered (in other words filled) with metal (and thus the partial solder pads 122, 342) have a round, e.g. circular, cross section, however, in general, the partial areas (and thus the partial solder pads 122, 342) may have any shape in cross section as desired. In this example, the partial solder pads 122, 342 may have a round shape with a diameter in the range from about 1 mm to about 4 mm, e.g. about 1.1 mm. In this example, the solder pad region 120 includes three rows and six columns of partial solder pads 122, 342, resulting in 18 partial solder pads 122, 342 altogether. The lateral minimum distance between respective two partial solder pads 122, 342 may be e.g. in 0.4 mm FIG. 3F shows an enhanced view of a partial solder pad 340 (e.g. an enhanced view of region A in FIG. 2) as would be provided in each of the solder pad regions 120 in accordance with various embodiments. As shown, only a portion, i.e. less than 100% of the area of the solder pad regions 120 is covered (in other words filled) with a metal 352, e.g. with the first metal (e.g. silver or nickel). In this example, about 79% of the area of the solder pad regions 120 is covered (in other words filled) with the metal 312. In this example, the partial areas covered (in other words filled) with metal (and thus the partial solder pads 122, 352) have a round, e.g. circular, cross section, however, in general, the partial areas (and thus the partial solder pads 122, 352) may have any shape in cross section as desired. In this example, the partial solder pads 122, 352 may have a round shape with a diameter in the range from about 1.5 mm to about 4 mm, e.g. about 4 mm. In this example, the solder pad region 120 includes one row and two columns of partial solder pads 122, 352, resulting in two partial solder pads 122, 352 altogether. The lateral minimum distance between respective two partial solder pads 122, 352 may be e.g. 0.4 mm.

Figure 3G:
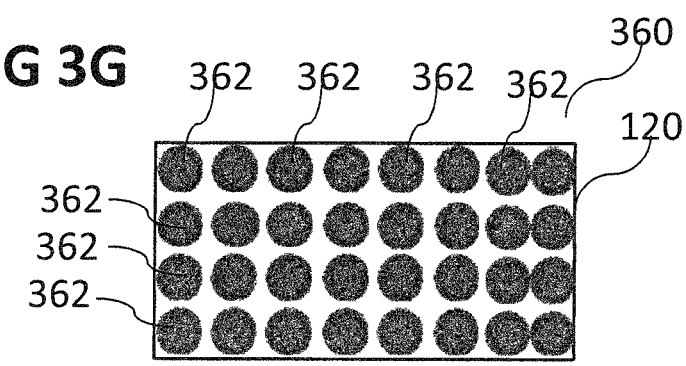

FIG. 3G shows an enhanced view of a partial solder pad 360 (e.g. an enhanced view of region A in FIG. 2) as would be provided in each of the solder pad regions 120 in accordance with various embodiments. In this example, about 38% of the area of the solder pad regions 120 is covered (in other words filled) with the metal 362. In this example, the partial areas covered (in other words filled) with metal (and thus the partial solder pads 122, 362) have a round, e.g. circular, cross section, however, in general, the partial areas (and thus the partial solder pads 122, 362) may have any shape in cross section as desired. In this example, the partial solder pads 122, 362 may have a round shape with a diameter in the range from about 0.5 mm to about 4 mm, e.g. about 0.7 mm. In this example, the solder pad region 120 includes four rows and eight columns of partial solder pads 122, 362, resulting in 32 partial solder pads 122, 362 altogether. The lateral minimum distance between respective two partial solder pads 122, 362 may be e.g. 0.4 mm.

Figure 3H:
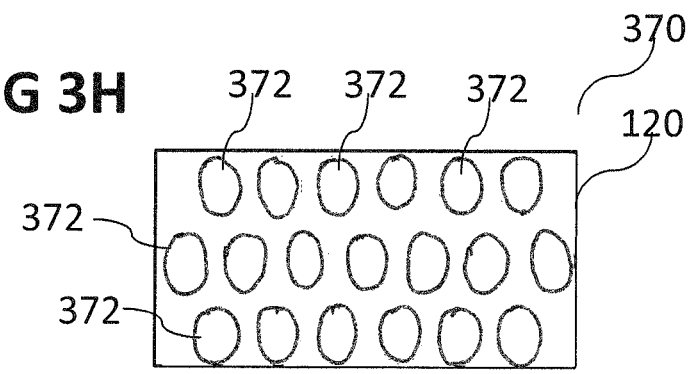

FIG. 3H shows an enhanced view of a partial solder pad 370 (e.g. an enhanced view of region A in FIG. 2) as would be provided in each of the solder pad regions 120 in accordance with various embodiments. In this example, about 52% of the area of the solder pad regions 120 is covered (in other words filled) with the metal 372. In this example, the partial areas covered (in other words filled) with metal (and thus the partial solder pads 122, 372) have a round, e.g. circular, cross section, however, in general, the partial areas (and thus the partial solder pads 122, 372) may have any shape in cross section as desired. In this example, the partial solder pads 122, 372 may have a round shape with a diameter in the range from about 1.5 mm to about 4 mm, e.g. about 1.1 mm. In this example, the solder pad region 120 includes three rows and six columns of partial solder pads 122, 372, resulting in 18 partial solder pads 122, 312 altogether, wherein the centers of the partial solder pads 122, 372 of immediately adjacent rows are laterally offset from each other. The lateral minimum distance between respective two partial solder pads 122, 372 may be e.g. 0.4 mm.

In various embodiments, the maximum overlap of the second metal on the first metal is 0.3 mm.

In various embodiments, instead of rectangular solder pads or oval solder pads in a conventional solar cell, a miniature disc partial solder pad design as shown in the figures and described in this disclosure may be provided. Illustratively, a virtual full area back (rear) solder pad region may be filled with real miniature partial solder pads which may have, but not limited to, round partial solder pads. The examples given in this disclosure depict designs with one or more rows of partial solder pads.

In various embodiments, the area (which corresponds to the silver paste consumption and the recombination area) shrinks substantially with decreasing diameter of the partial solder pads. The effective overlap area on the other hand may increase.

In a conventional solder pad design, the overlap area often acts as a stress concentration area during soldering. Increasing the overlap areas and using round solder pad designs should help to distribute the stress over more area (due the lack of sharp stress concentration corners) and therefore should be more gentle to the solar cell than the conventional full area design.

The embodiments perfectly fit into the conventional production process so that no additional process steps are required. The new design in accordance with various embodiments just requires a new print screen with the new design in accordance with the partial solder pads. The width of the overlap area between the first metal and the second metal (between silver and aluminium) can be varied and is just limited by the alignment specification of the printline.

Furthermore, it should be noted that also other aspect ratios or continuous dotted lines may be provided in accordance with various embodiments.

Various embodiments may be valuable/applicable for multi busbar designs where more than three rows of back (rear) solder pads are needed.

In various embodiments, the partial solder pad may have a diameter of at least 50 µm.

In various embodiments, some of the partial solder pads may even partially contact each other, wherein e.g. a plurality of partial solder pads may be understood as forming a plurality of partial solder pads in case the minimum of a first partial solder pad of the plurality of partial solder pads is falling to the maximum of a second partial solder pad of the plurality of partial solder pads. In other words, this may e.g. mean an overlap of a first partial solder pad and a second partial solder pad by half of the width of the first or second partial solder pad.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A solar cell, comprising:
    a substrate comprising a front side and a rear side, wherein at least the front side receives light;
    a plurality of rear side solder pad regions at least partially arranged over the rear side,
    wherein at least one first dielectric layer separates adjacent rear side solder pad regions by a first distance;
    a plurality of partial solder pads formed in each rear side solder pad region of the plurality of rear side solder pad regions, wherein at least one second dielectric layer separates adjacent partial solder pads within each rear side solder pad region by a second distance such that the plurality of partial solder pads and at least one second dielectric layer within each rear side solder pad region are disposed in an alternating manner in a direction along the rear surface,
    wherein the first distance is greater than the second distance,
    wherein each partial solder pad comprises a first metal, and
    a rear side metallization formed at the rear side of the substrate partly overlapping the partial solder pads, the rear side metallization comprising a second metal different from the first metal,
    wherein at least one of the partial solder pads in each rear side solder pad region extends at least substantially from the rear side of the substrate to the rear side metallization.

2. The solar cell of claim 1,
    wherein each rear side solder pad region of the plurality of rear side solder pad regions has a covered surface area greater than 10 mm$^2$.

3. The solar cell of claim 1,
    wherein the first distance is in the range from about 2 mm to about 20 mm.

4. The solar cell of claim 1,
    wherein the second distance is in the range from about 0.1 mm to about 1.0 mm.

5. The solar cell of claim 1,
    wherein a maximum overlap of the second metal on the first metal is 0.3 mm.

6. The solar cell of claim 1,
    wherein at least two rows of partial solder pads are formed in each rear side solder pad region of the plurality of rear side solder pad regions.

7. The solar cell of claim 6,
    wherein at least four partial solder pads are formed in each rear side solder pad region of the plurality of rear side solder pad regions.

8. The solar cell of claim 1,
    wherein the partial solder pads have a round shape with a diameter in the range from about 1.5 mm to about 4 mm.

9. The solar cell of claim 8,
    wherein the partial solder pads are O-ring shaped and have inner diameter of at least 0.5 mm.

10. The solar cell of claim 1,
    wherein the plurality of rear side solder pad regions are arranged in a plurality of columns and a plurality of rows over the rear side of the substrate.

11. The solar cell of claim 6,
    wherein the partial solder pads of a first row are arranged offset to a second row.

12. The solar cell of claim 1,
    wherein the first metal comprises silver or nickel and the second metal comprises aluminum.

13. A solar cell, comprising:
    a substrate comprising a front side and a rear side, wherein at least the front side receives light;
    a plurality of rear side solder pad regions at least partially arranged over the rear side,
    wherein at least one first dielectric layer separates adjacent rear side solder pad regions by a first distance,
    a plurality of partial solder pads formed within each rear side solder pad region of the plurality of rear side solder pad regions, wherein at least one second dielectric layer separates adjacent partial solder pads within each rear side solder pad region by a second distance such that the plurality of partial solder pads and at least one second dielectric layer within each rear side solder pad region are disposed in an alternating manner in a direction along the rear surface,
    wherein the first distance is greater than the second distance,
    wherein each partial solder pad comprises a first metal;
    a rear side metallization formed at the rear side of the substrate partly overlapping the partial solder pads, the rear side metallization comprising a second metal different from the first metal, wherein at least one of the partial solder pads in each rear side solder pad region extends at least substantially from the rear side of the substrate to the rear side metallization, wherein the rear side metallization penetrates through the dielectric layer to contact the at least one of the partial solder pads.

14. The solar cell of claim 13, wherein the first distance is in the range from about 2 mm to about 20 mm.

15. The solar cell of claim 13, wherein the second distance is in the range from about 0.1 mm to about 1.0 mm.

16. The solar cell of claim 13, wherein a maximum overlap of the second metal on the first metal is 0.3 mm.

* * * * *